United States Patent [19]
Reich et al.

[11] Patent Number: 4,588,908
[45] Date of Patent: May 13, 1986

[54] N-ARY INPUT TO N-1 BINARY OUTPUTS LEVEL SHIFT CIRCUIT FOR I²L

[75] Inventors: Joachim Reich, Ahrensburg; Henning Schwarz, Reinbek, both of Fed. Rep. of Germany

[73] Assignee: U.S. Philips Corporation, New York, N.Y.

[21] Appl. No.: 585,663

[22] Filed: Mar. 2, 1984

[30] Foreign Application Priority Data

Mar. 16, 1983 [DE] Fed. Rep. of Germany ....... 3309396

[51] Int. Cl.⁴ .......................................... H03K 19/092
[52] U.S. Cl. ................................... 307/475; 307/454; 307/455; 307/459; 307/473; 307/474; 307/361
[58] Field of Search ............... 307/443, 454, 455, 459, 307/473–475, 477, 361, 244, 254, 264

[56] References Cited

U.S. PATENT DOCUMENTS

| | | | |
|---|---|---|---|
| 4,140,920 | 2/1979 | Dao et al. | 307/473 X |
| 4,158,782 | 6/1979 | Price, Jr. | 307/475 |
| 4,326,135 | 4/1982 | Jarrett et al. | 307/477 X |
| 4,357,548 | 11/1982 | Preslar | 307/459 X |
| 4,429,234 | 1/1984 | Streit | 307/244 X |
| 4,439,695 | 3/1984 | Pelletier et al. | 307/475 X |
| 4,459,496 | 7/1984 | Yamada et al. | 307/459 |

FOREIGN PATENT DOCUMENTS

| | | | |
|---|---|---|---|
| 2740832 | 3/1979 | Fed. Rep. of Germany | 307/475 |
| 0115036 | 9/1981 | Japan | 307/475 |

*Primary Examiner*—Stanley D. Miller
*Assistant Examiner*—D. R. Hudspeth
*Attorney, Agent, or Firm*—Jack E. Haken; James J. Cannon, Jr.

[57] ABSTRACT

A circuit for level adaptation between an I²L circuit and a preceding combinatory logic circuit. The input current for the I²L circuit is supplied by a direct current source which is connected to several switches which are controlled by the level on the output of the combinatory logic circuit, at least one of the outputs thereof being connected to an input of the I²L circuit via a current mirror.

1 Claim, 4 Drawing Figures

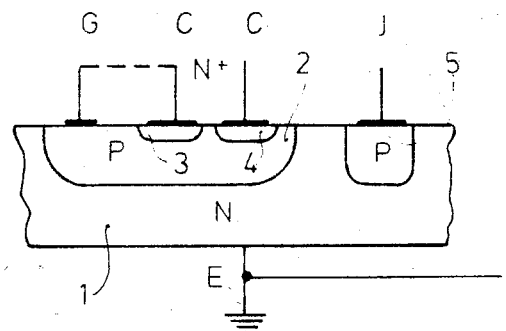
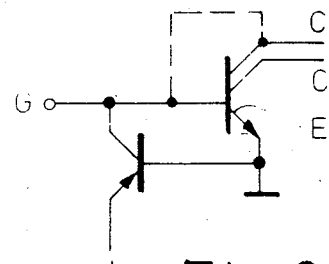
Fig.1          Fig.2
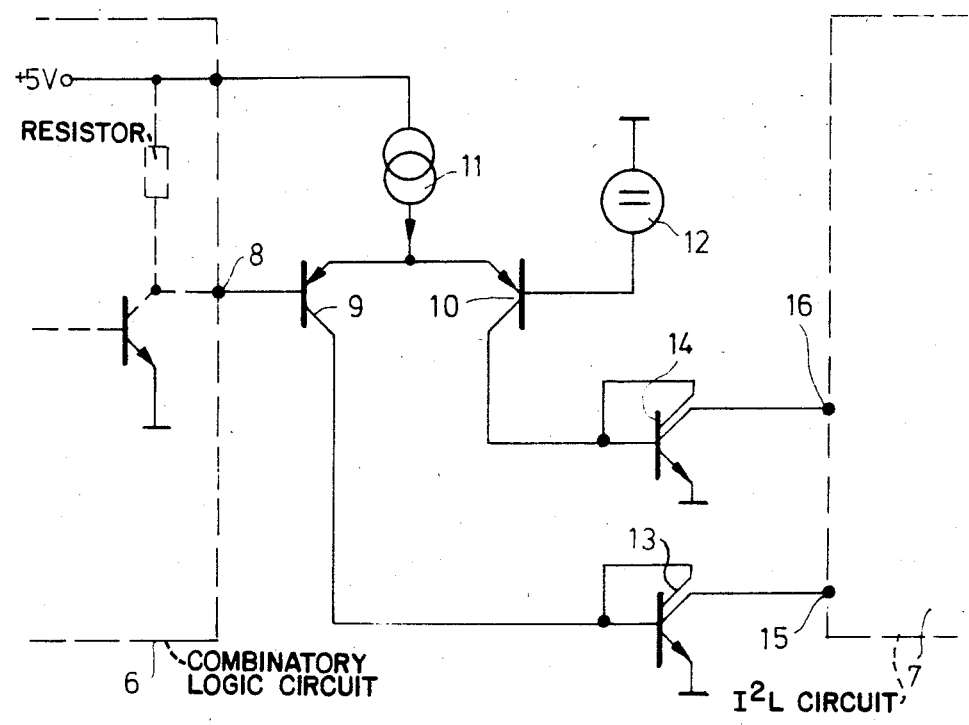
Fig.3

N-ARY INPUT TO N-1 BINARY OUTPUTS LEVEL SHIFT CIRCUIT FOR I²L

BACKGROUND OF THE INVENTION

1. Field of the Invention

The invention relates to a circuit arrangement for level adaptation between an I²L circuit and a preceding combinatory logic circuit, comprising a direct current source which is connected to the input of a switch which can be controlled in dependence of the level on the output of the combinatory logic circuit, at least one of the two outputs of the switch being connected to the input of a current mirror whose output is connected to the input of the I²L circuit.

2. Description of the Prior Art

I²L circuits (I²L=integrated injection logic) which are described in Valvo-Berichten, Volume XVIII, pages 215-226, as well as in Philips techn. Rdsch. 33, 1973/74, pages 82 to 91, require comparatively low voltage levels (0 V and 0.7 V) for getting into the one or the other logic state ("0" and "1", respectively). However, circuits manufactured using another technological process, for example TTL circuits, produce essentially higher levels on their output, for example 0 V/5 V. Therefore, when the output signals of such a circuit are to be processed by an I²L circuit level adaptation is required.

In said Valvo-Berichten FIG. 14b) a resistor is connected for this purpose between the input of the I²L circuit and the output of the preceding circuit. It is a drawback of this solution that this resistor must be comparatively large, that is to say larger as the supply voltage of the preceding circuit is higher. because the input currents of an I²L circuit are comparatively small (for example, 20 μA). Such a high-ohmic matching resistor would require a very large surface area in an integrated circuit, so that this solution is hardly suitable for the integrated circuit technique. Moreover, the input levels of the I²L circuit are co-determined by the supply voltage of the preceding circuit, which is also a drawback.

A level adaptation circuit for I²L circuits is known from No. DE-A-3137010. The circuit disclosed therein enables conversion from one level to another level. In order to enable adaptation of a number of levels to I²L levels, a corresponding number of circuits would be required. This represents a complex and voluminous solution.

It is the object of the present invention to provide a circuit which can be very easily constructed as an integrated circuit and which enables adaptation of several higher output levels of a preceding circuit to the lower input levels of an I²L circuit.

This object is achieved in accordance with the invention in that the circuit arrangement is designed for the conversion of n different levels on the output of the preceding circuit wherein n is larger than or equal 3, there being provided n−1 emitter-coupled transistor pairs, the base of one transistor of each pair being coupled to the output of the preceding circuit, the collector-emitter paths of these transistors being connected in series, the emitter of one transistor pair which is not connected to a collector being connected to the current source, the collector electrode of the other transistor of the transistor pairs being connected to a current mirror, the base electrodes thereof being connected to a reference voltage, the reference voltages on the base electrodes being staggered so that the transistor pair which is connected to the current source receives the lowest voltage (relative to the supply voltage terminal whereto the current source is connected), the transistor pair which is connected thereto receiving the lowest voltage but one, etc.

The current supplied by the current-source flows into one of the current mirrors independence of the settings of the switch-transistor pairs and the same current flows out of said current mirror into one of the inputs of the I²L-circuits. So an additional current source is not necessary.

BRIEF DESCRIPTION OF THE DRAWINGS

The invention will be described in detail hereinafter with reference to the accompanying drawings. Therein:

FIG. 1 shows a diagram of the construction of an I²L gate;

FIG. 2 shows the associated equivalent diagram;

FIG. 3 shows a state of the art circuit; and

DESCRIPTION OF THE PREFERRED EMBODIMENT

Figure 4:
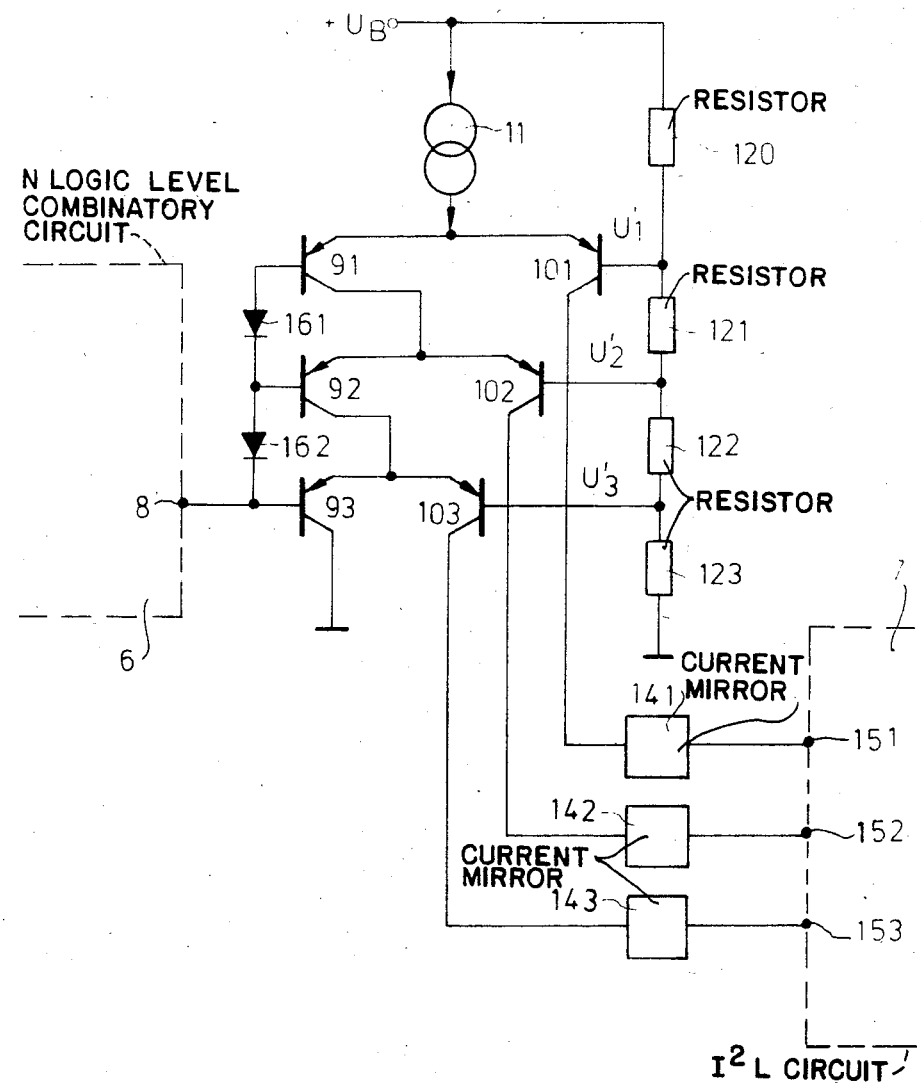
FIG. 4 shows a circuit for the conversion of different output levels in accordance with the invention.

FIG. 1 is a cross-sectional view of the semiconductor body of an I²L inverter which forms a basic component of an I²L circuit. In an epitaxial N− layer 1 there is formed a P-region 2 which encloses two N+ zones 3 and 4. The zones 1 . . . 4 form a vertical npn transistor, the zone 1 acting as an emitter, the zone 2 as a base G, and the zones 3 and 4 as collectors. The transistor thus formed is referred to hereinafter as a gate transistor. In the vicinity of the P-region 2 there is situated an additional P-region 5 (the so-called injector) which forms, in conjunction with the epitaxial N-layer 1 and the P-region 2, a lateral transistor, so that the equivalent diagram shown in FIG. 2, is obtained.

The reference numeral 6 in FIG. 3 denotes a combinary logic circuit whose output carries a level of 0 V and 5 V, respectively. This level is converted by the adaptation circuit so that it can be processed by the subsequent I²L circuit 7. The adaptation circuit comprises a switch which consists of two emitter-coupled pnp-transistors 9 and 10 whose inter-connected emitters are connected, via a current source 11 which supplies a direct current of 20 μA, to a positive supply voltage which is preferably the same voltage as used for the circuit 6. The base of the transistor 9 is connected to the output 8 of the circuit 6, the base of the transistor 10 being connected to a reference voltage source 12 so that the potential on the base of the transistor is always higher than one logic level on the output 8 (0 V), but always lower than the other logic level (+5 V) on this output. Consequently, the current supplied by the current source 11 always flows via one of the two transistors 9 and 10.

Each of the collectors of the transistors 9 and 10 is connected to a current mirror 13, 14, respectively. Each of these current mirrors is formed by a gate transistor which comprises two collectors, one of which (as denoted by broken lines in the FIGS. 1 and 2) is connected to its base, the other collector (the output of the current mirror) being each time connected to one input 15, 16, respectively, of the I²L circuit. The emitters of the gate transistors forming the current mirrors 13, 14 are connected to ground. The current supplied by the current source 11 flows either via the transistor 9 or the transistor 10 of the switch to the current mirror 13, 14, respectively, connected thereto and further to the input 15, 16, respectively, of the I²L circuit 7 connected thereto. The value of the current supplied by the current source 11 is chosen so that the relevant input can be switched.

The logic levels on the outputs of the current mirrors 13 and 14 are complementary: when one current mirror carries current, the other mirror does not carry a current and vice versa. Should only one of the two levels be required in the I²L circuit 7, one of the two current mirrors can be omitted; the collector of the associated transistor is then connected to ground. For the current mirror use can be made of a transistor comprising more than two collector zones (as shown in FIGS. 1 and 2), in order to drive more than one input of the I²L circuit. In that case either the surface ratios of the gate transistor forming the current mirror must be chosen so that the collector currents have the required value, or the current of the current source 11 must be chosen larger accordingly.

The gate transistors forming the current mirrors 13 and 14 are preferably formed during the same manufacturing operation as the gate transistors in the I²L circuit 7, so that the manufacture is simplified. The ourrent source 11 can be formed by a pnp-transistor which forms part of a current mirror. The reference voltage on the base electrode of the transistor 10 can be derived from the supply voltage by means of a voltage divider comprising a diode.

The circuit shown in FIG. 3 is capable of preparing two different input levels (0 V/5 V) for a subsequent I²L circuit. When instead n input levels must be prepared (n≧3), this could be achieved in principle by means of n−1 adaptation circuits as shown in FIG. 3. However, n−1 input terminals and a corresponding number of current sources would then be required.

FIG. 4 shows a substantially simpler embodiment in accordance with the invention (for n=4). The circuit consists of three emitter-coupled transistor pairs 91-101, 92-102, 93-103. The base electrodes of the transistors 91, 92 and 93 are interconnected as well as connected to the output 8 of the circuit 6 on which four different potentials 0 V, $U_1$, $U_2$ and $U_3$ can occur. The potentials $U_1 \ldots U_3$ are positive, $U_2$ being smaller than $U_1$ and $U_3$ being smaller than $U_2$, and $U_1$ at the most equal to the supply voltage $U_B$. The interconnected emitters of the pnp-transistors pair 91, 101 are connected to the positive supply voltage via the current source 11, the emitters of the pnp-transistor pair 92-102 being connected to the collector of the transistor 91, while the emitters of the pnp-transistor pair 93-103 are connected to the collector of the transistor 92. The bases of the transistors 101, 102 and 103 are connected to the three tappings of a multiple voltage divider consisting of four resistors 120 . . . 123, so that the direct voltage $U_1'$ appears on the base of the transistor 101, the direct voltage $U_2'$ on the base of the transistor 102, and the direct voltage $U_3'$ on the base of the transistor 103. The multiple voltage divider 120-123 is proportioned so that in comparison with ground potential, the voltage $U_3'$ is lower than the voltage $U_3$, the voltage $U_2'$ is lower than the voltage $U_2$ but higher than the voltage $U_3$, and the voltage $U_1'$ is lower than the voltage $U_1$ but higher than the voltage $U_2$. Each of the collectors of the transistors 101, 102 and 103 is connected to an input (151, 152, 153, respectively) of the I²L circuit via each time a current mirror 141, 142, 143, respectively.

When the level on the output 8 corresponds to $U_1$, only the current mirror 141 in this circuit carries a current, while in the case of the level $U_2$ on the input 8 only the current mirror 142 carries a current and only the current mirror 143 carries a current in the case of the level $U_3$. When the input 8 carries 0 V, none of the current mirrors carries a current; if necessary, in that case a signal could still be applied to the I²L circuit 7 by means of a current mirror in the collector lead of the transistor 93.

In order to avoid the occurrence of parasitic transistors, diodes 161, 162 may be provided; these diodes can be integrated in the transistors 92, 93 without a significant amount of surface area being required.

What is claimed is:

1. A circuit for level adaptation between an I²L circuit and a preceding combinatory logic circuit, comprising a direct current source (11) which is connected to the input of a switch which is controlled in dependence on the level of the output (8) of the combinatory logic circuit (6), characterized in that the circuit is designed for the conversion of n different logic levels on the output of the preceding circuit where n is greater than or equal to 3, the switch comprising n−1 emitter-coupled transistor pairs (91, 101; 92, 102; 93, 103), the base of one transistor (91, 92, 93) of each pair being coupled to the output (8) of the preceding circuit, the collector-emitter current path of each of said one transistor of each pair being respectively connected in series, with the emitter of the first transistor (91) of said transistors connected in series being connected to said current source (11), the collector of the other transistor (101, 102, 103) of each pair being connected to a current mirror (141, 142, 143), the base of each of said other transistor of each pair being respectively connected to a different reference voltage ($U_1'$, $U_2'$, $U_3'$), wherein the reference voltages supplied to said bases of said other transistors of each pair are ordered such that the other transistor (101) of said pair having said one transistor (91) connected to the current source (11), receives the highest reference voltage ($U_1'$).

* * * * *